United States Patent [19]

Toda et al.

[11] Patent Number: 5,097,450
[45] Date of Patent: Mar. 17, 1992

[54] SEMICONDUCTOR MEMORY DEVICE HAVING A PLURALITY OF MEMORY BLOCKS

[75] Inventors: Haruki Toda, Yokohama; Kenji Komatsu, Tokyo, both of Japan

[73] Assignee: Kabushiki Kaisha Toshiba, Kawasaki, Japan

[21] Appl. No.: 515,336

[22] Filed: Apr. 30, 1990

Related U.S. Application Data

[63] Continuation of Ser. No. 833,593, Feb. 27, 1986, abandoned.

[30] Foreign Application Priority Data

Feb. 28, 1985 [JP] Japan .................. 60-39337

[51] Int. Cl.$^5$ .................................................. G11C 7/00
[52] U.S. Cl. .................................................. 365/230.03
[58] Field of Search ............... 365/230.01, 230.03, 365/230.04, 230.06, 189.01, 227

[56] References Cited

U.S. PATENT DOCUMENTS

| | | | |
|---|---|---|---|
| 3,855,580 | 12/1974 | Lighthall . | |
| 4,104,735 | 8/1978 | Hofmann | 365/230 |
| 4,241,425 | 12/1980 | Cenker et al. | 365/222 |
| 4,338,679 | 7/1982 | O'Toole | 365/203 |
| 4,393,472 | 7/1983 | Shimada | 365/230 |
| 4,429,374 | 1/1984 | Tanimura | 365/230 |
| 4,486,860 | 12/1984 | Takemae et al. | 365/230.03 X |
| 4,569,036 | 2/1986 | Fujii et al. | 365/230 |
| 4,608,672 | 8/1986 | Roberts et al. | 365/230.04 |
| 4,628,489 | 12/1986 | Ong et al. | 365/230.04 |
| 4,636,982 | 1/1987 | Takemae | 365/23 X |
| 4,651,031 | 3/1987 | Kamuro | 365/230 X |
| 4,995,088 | 2/1991 | Farhai | 382/15 |

FOREIGN PATENT DOCUMENTS 0087754 1/1982 European Pat. Off. .
0115187 7/1984 European Pat. Off. .
0055582 10/1987 European Pat. Off. .

OTHER PUBLICATIONS

Farhai, "Architectures for Optoelectronic Anazols of Self-Organizing Neuron Networks", Optics Letters, vol. 12, No. 6, 1987, pp. 448-450.
Fujii et al., "A Low-Power Sub 100 ns 256K Bit Dynamic RAM", IEEE Journal of Solid-State Circuits, vol. SC-18, No. 5, Oct. 1983.

*Primary Examiner*—Alyssa H. Bowler
*Attorney, Agent, or Firm*—Finnegan, Henderson, Farabow, Garrett, and Dunner

[57] ABSTRACT

A semiconductor memory device comprises a plurality of memory blocks which are divided into a plurality of memory groups and which each include a plurality of memory cells and a plurality of word lines for selecting the memory cells, a plurality of row decoders, provided at least one for each of the memory groups, for selecting at least one of the word lines in the memory block in response to part of a word line selection address signal, and for biasing this selected word line with an input drive signal, and a drive signal generating circuit for generating a drive signal for driving the word line. This device further includes a drive signal selection circuit for selectively supplying a drive signal from the drive signal generating circuit to the row decoders corresponding to one of the memory groups specified by the remaining portion of the address signal.

6 Claims, 7 Drawing Sheets

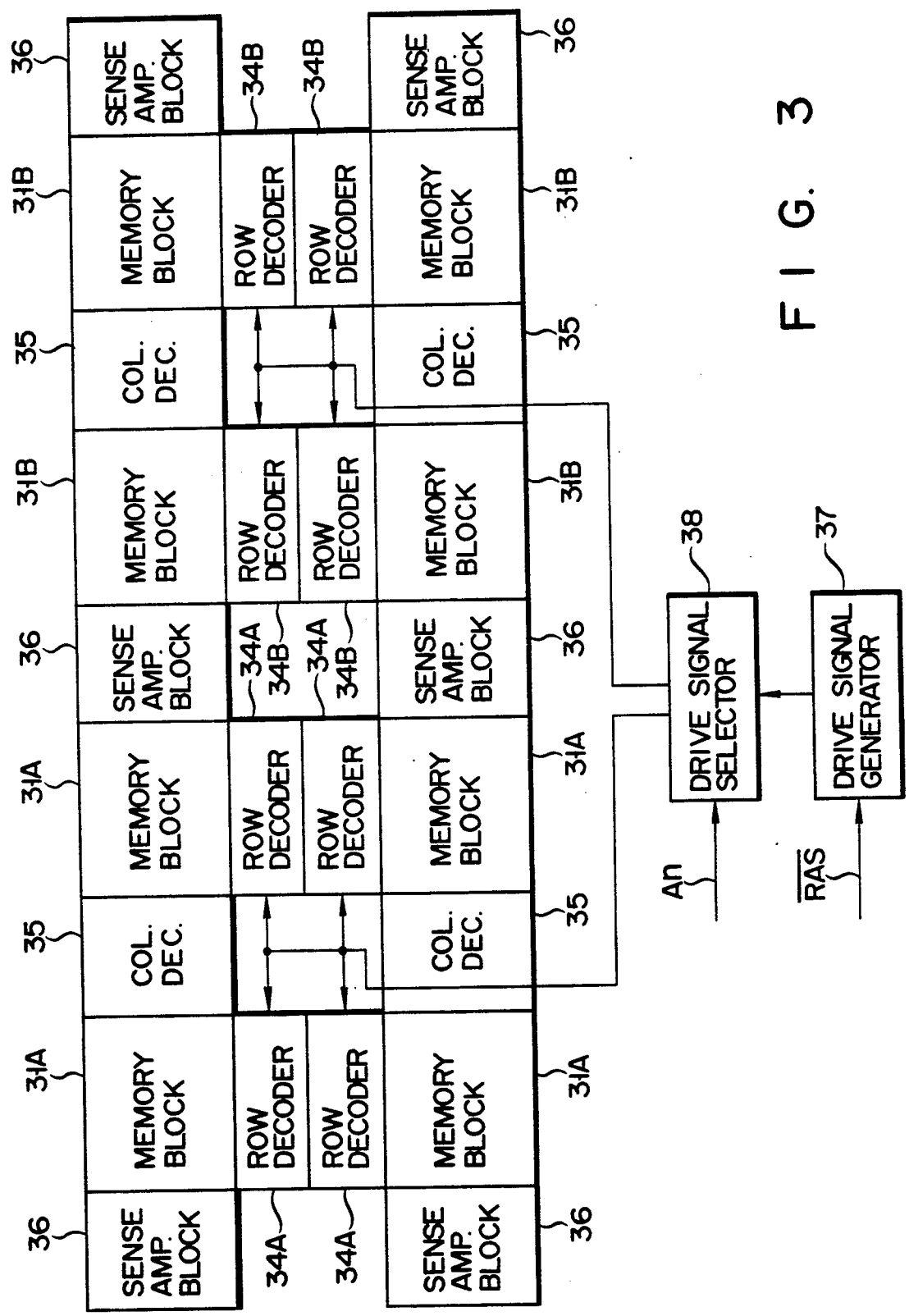
F I G. 3

SEMICONDUCTOR MEMORY DEVICE HAVING A PLURALITY OF MEMORY BLOCKS

This application is a continuation of application Ser. No. 833,593, filed Feb. 27, 1986, now abandoned.

BACKGROUND OF THE INVENTION

The invention relates to a semiconductor memory device having a plurality of memory cells which are selectively driven in response to a drive signal.

With integrated semiconductor memory devices (IC memory), signal propagation delay of the word line must be decreased and the voltage of the bit line signal read from the memory cell must be maintained stable at a sufficiently high level in order to increase speed and the degree of integration as well as in order to decrease the power consumption of the device. In order to accomplish this, the IC memory is divided into a plurality of memory cell blocks and the memory cells are selected by the individual blocks.

FIG. 1 shows the prior art IC memory device which has a plurality of memory blocks 11 each comprised of a plurality of memory cells. As can be seen from one of the memory blocks in the drawing, word lines 12 and bit lines 13 are provided for each cell in order to select a memory cell. Although not shown in the drawing, each memory cell is located at an intersection of each word and bit line 12, 13 so as to be coupled to each. Also, this IC memory includes row decoders 14, which are provided for each block 11 and which select a word line 12 in each memory block 11 based on a row address signal and further includes column decoders 15 which are also provided for each pair of blocks contiguous in the horizontal direction, for example, and which select bit lines 13 in each block 11 based on a column address signal.

In this case, one row decoder 14 is provided for each memory block 11. Similarly, with column decoders 15, one decoder may be provided for each pair of memory blocks 11 that are vertically contiguous, for example. Sense amps 16 amplify the data read from or written into at least one memory cell selected by row decoder 14 and column decoder 15. In other words, when sense amps 16 read out data, they amplify and hold data read out of the corresponding memory cells, and when they write in data, they hold the data that is to be written into the corresponding memory cells.

Drive signal generator 17 supplies drive signal $\phi 1$ to row decoder 14. If the memory is dynamic random access memory (dRAM), drive signal generator 17 generates signal $\phi 1$ in response to changes in the row address strobe signal $\overline{RAS}$, which is provided simultaneously with the row address signal.

FIG. 2 is a detailed circuit diagram of a row decoder 14 of the prior art IC memory. In the description below, the MOS transistors are all enhancement-type n-channel transistors.

Transistor 22 is provided between power source terminal Vcc and decoder signal output line 21 and precharge signal $\phi 2$ is supplied to the gate of this transistor. A plurality of transistors 23 are provided in parallel between decode signal output terminal 21 and reference potential source terminals Vss. These transistors 23 are for decoding the row address signals and a bit signal expressing a special combination of row address signals is supplied to the gate of each.

The gate of transistor 24 is connected to decode signal output line 21. Signal $\phi 1$ generated by drive signal generator 17 is supplied to one end of the current path of transistor 24 and the other end is connected to the corresponding word line 12. That is to say, with this kind of row address decoder 14, first a precharge signal $\phi 2$ is supplied to the gate of transistor 22 to charge the decode signal output line 21 to level "1". Next, when the row address signal is generated, drive signal generator 17 generates signal $\phi 1$ based on the row address strobe signal $\overline{RAS}$ as well as turns off all of transistors 23 through only one row address decoder 14. Then, decode signal output line 21 is kept at the "1" level and transistor is turned on.

Accordingly, the corresponding word line 12 is charged to "1" level by the drive signal $\phi 1$ supplied to transistor 24. After this, all the memory cells connected to this word line 12 are accessed and based on the column signals supplied after this, column decoder 15 selects a special bit line 13 to thereby select at least one memory cell in one memory block 11. Then, reading out or writing in of data is performed for this memory cell.

At this time, in the other row address decoder 14, at least one of transistors 23 is turned on and this caused decode signal output line 21 to be charged to a "0" level. Accordingly, transistor 24 is turned off and drive signal $\phi 1$ is not supplied to the corresponding word line 12.

With this kind of prior art memory, drive signal $\phi 1$, which is used for selecting word lines 12, is supplied in parallel to all of row decoders 14, which each determine whether the word lines 12 will be charged to level "1" based on the individual row address signals. With this kind of memory there is no problem if there are few memory cells and there are few row decoders 14 to which signal $\phi 1$ must be supplied.

With the recent drastic increases in memory integration together with an increase in the number of memory cells, however, the number of row decoders 14 has increased, resulting in an increase in the number of wires between row decoders 14 and drive signal generator 17 and in the length of those wires. The stray capacitance associated with these wires is a multiple of the parasitic capacitance associated with one word line 12 to be driven in the end by drive signal $\phi 1$. Furthermore, the increase in resistance of the wire results in great attenuation of drive signal $\phi 1$ before it charges word line 12 to level "1". Accordingly, in the past, much time was required until the selected word line 12 rose to a sufficiently high level to be considered level "1", which slowed down the operating speed.

In order to improve this operating speed, the current capacity of signal $\phi 1$ must be increased and, to do this, the element area of the transistors comprising drive signal generator 17 must be increased. This in turn results in an increase in chip area when the circuitry is integrated.

SUMMARY OF THE INVENTION

The object of the invention is to provide a semiconductor memory device in which the selected word line can be driven in a short time and in which the chip area can be reduced for integration.

In order to achieve this object the semiconductor memory device comprises a plurality of memory blocks which are divided into a plurality of memory groups and which each include a plurality of memory cells and a plurality of word lines for selecting said memory cells, a plurality of word line selection circuits, provided at least one for each of said memory groups, for selecting at least one word line in said memory block in response to part of a word line selection address signal, and for biasing this selected word line with an input drive signal, a drive signal generating circuit for generating a drive signal for driving said word line, and a drive signal selection circuit for selectively supplying a drive signal from said drive signal generating circuit to said word line selection circuit corresponding to one of the memory groups specified by the remaining portion of said address signal.

In this invention, the drive signal from the drive signal generating circuit is not supplied simultaneously to all the word line selection circuits, but rather is applied only to the word line selection circuit selected by, for example, the one-bit signal, of the word line selection address signals. In other words, the drive signals from the drive signal selection circuit are transmitted to the corresponding word line selection circuit via the column signal lines. Thus, it is possible to shorten the overall length of the signal lines between the drive signal selection circuit and each word line selection circuit, and to therefore suppress stray capacitance that accompanies the signal lines and, consequently, to decrease the signal propagation delay along the signal lines.

BRIEF DESCRIPTION OF THE DRAWINGS

This invention may be better understood when taken in conjunction with the drawings, in which:

FIG. 3 is a schematic diagram of the memory device according to the first embodiment of this invention;

DETAILED DESCRIPTION OF THE PREFERRED EMBODIMENT

FIG. 3 shows the construction of the semiconductor memory device of this invention as applied to a dynamic RAM. In this embodiment, the memory cells are divided into memory blocks the same as with the prior art device. With this memory device, a plurality of memory blocks 31A and 31B are formed on the same chip and these blocks are selected, for example, based on the MSB signal of the row address signal; a memory cell in one of the memory blocks (31A) is selected when the MSB signal An of the row address signal is 0 level, and a memory cell in the other memory block (31B) is selected when the MSB signal An of the row address signal is level 1.

Figure 4:
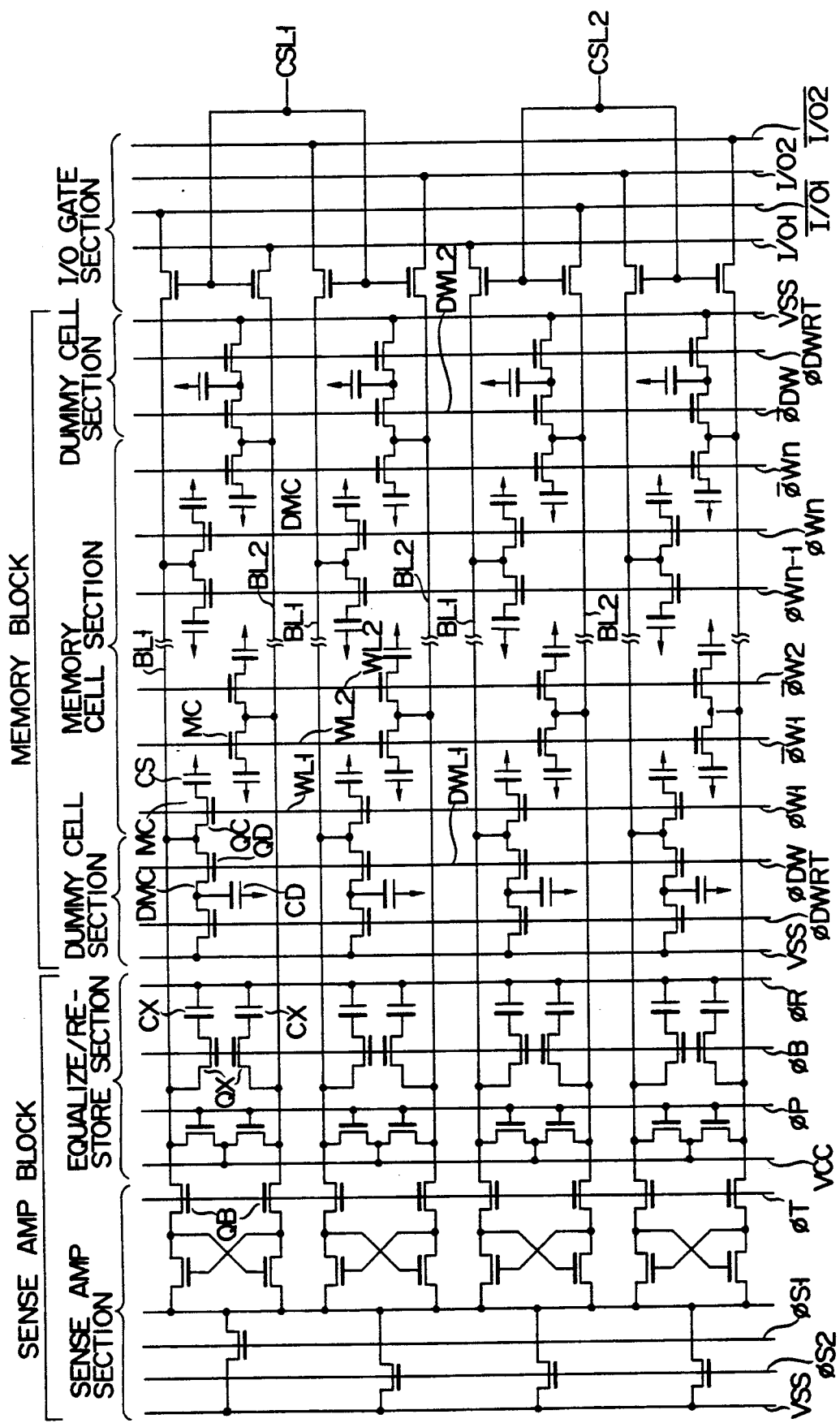
FIG. 4 is a circuit diagram of the memory block and sense amplifier block of the device shown in FIG. 3.

As shown in FIG. 4, a plurality of word lines WL1, WL2 and bit lines BL1, BL2 for selecting memory cell MC are provided in memory blocks 31A, 31B. A memory cell MC is located at each intersection of word lines WL1, WL2 and bit lines BL1, BL2. Each memory cell MC includes capacitor CS and MOS transistor QC to the gate of which is coupled word line WL1 or WL2. Each memory block further includes a MOS transistor OD to the gate of which is coupled dummy word line DWL1 or DWL2, and capacitor DMC.

FIG. 4 shows sense amp block 36 which amplifies the data in memory block 31A or 31B and in bit lines BL1 and BL2 of these memory blocks. The dummy cell section of these memory blocks are used to maintain the reference potential level used at the time data is read from the memory cells. The dummy cells DMC in these dummy cell sections are constructed of MOS transistor QD and capacitor CD which has half the capacity of capacitor CS.

Figure 7:
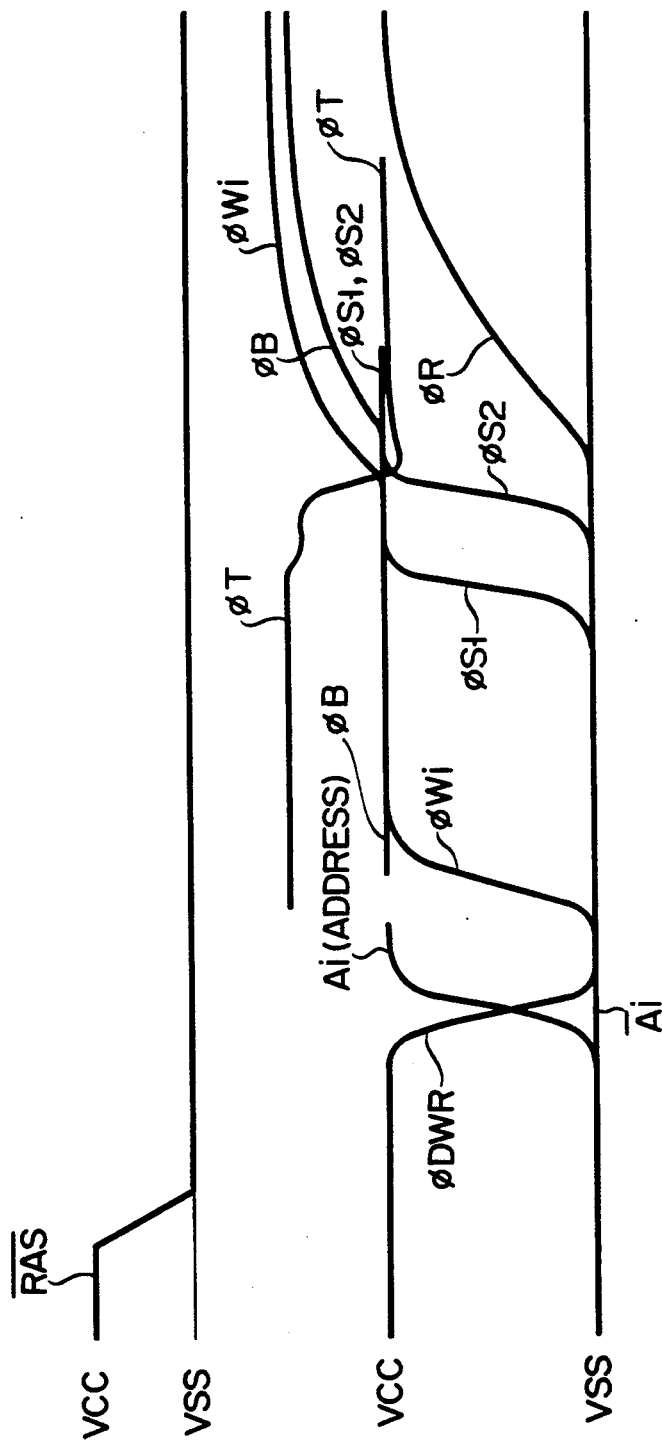
FIG. 7 is a signal waveform diagram showing the operation of the circuit of FIG. 4.

During the precharging time, control signal $\phi$DWR is set at the high level, as is shown in FIG. 7 and Vss level is written into the dummy cell. Control signal $\phi$DW or $\overline{\phi DW}$ for driving the memory cells DMC rises when control signal $\phi$Wi or $\overline{\phi Wi}$ for driving memory cells MC have risen.

The I/O gate section is driven by control signal CSL1 or CSL2 from column decoder 35 and data in bit lines BL1 and BL2 is selectively transmitted to input lines $\overline{IO1}$, IO1 and $\overline{IO2}$ and IO2.

Row decoder 34A, which is provided in each memory block 31A, selects word lines WL1 or WL2 in each memory block 31A based on all the remaining row address signals A1 to An-1 except the MSB signal An. Similarly, row decoder 34B, which is provided in each memory block 31B, selects word lines WL1 or WL2 in each memory block 31B based on all the remaining row address signals A1 to An-1 except the MSB signal An.

Column decoder 35, which is provided for each pair of memory blocks that are contiguous in the horizontal direction, for example, selects bit lines BL1 and BL2 of memory blocks 31A and 31B in response to a column address signal. In this case, row decoders 34A and 34B are provided one for each of memory blocks 31A and 31B, however, they may be provided one per pair of memory blocks that are contiguous in the vertical direction, for example, the same as with column decoder 35.

Figure 1:
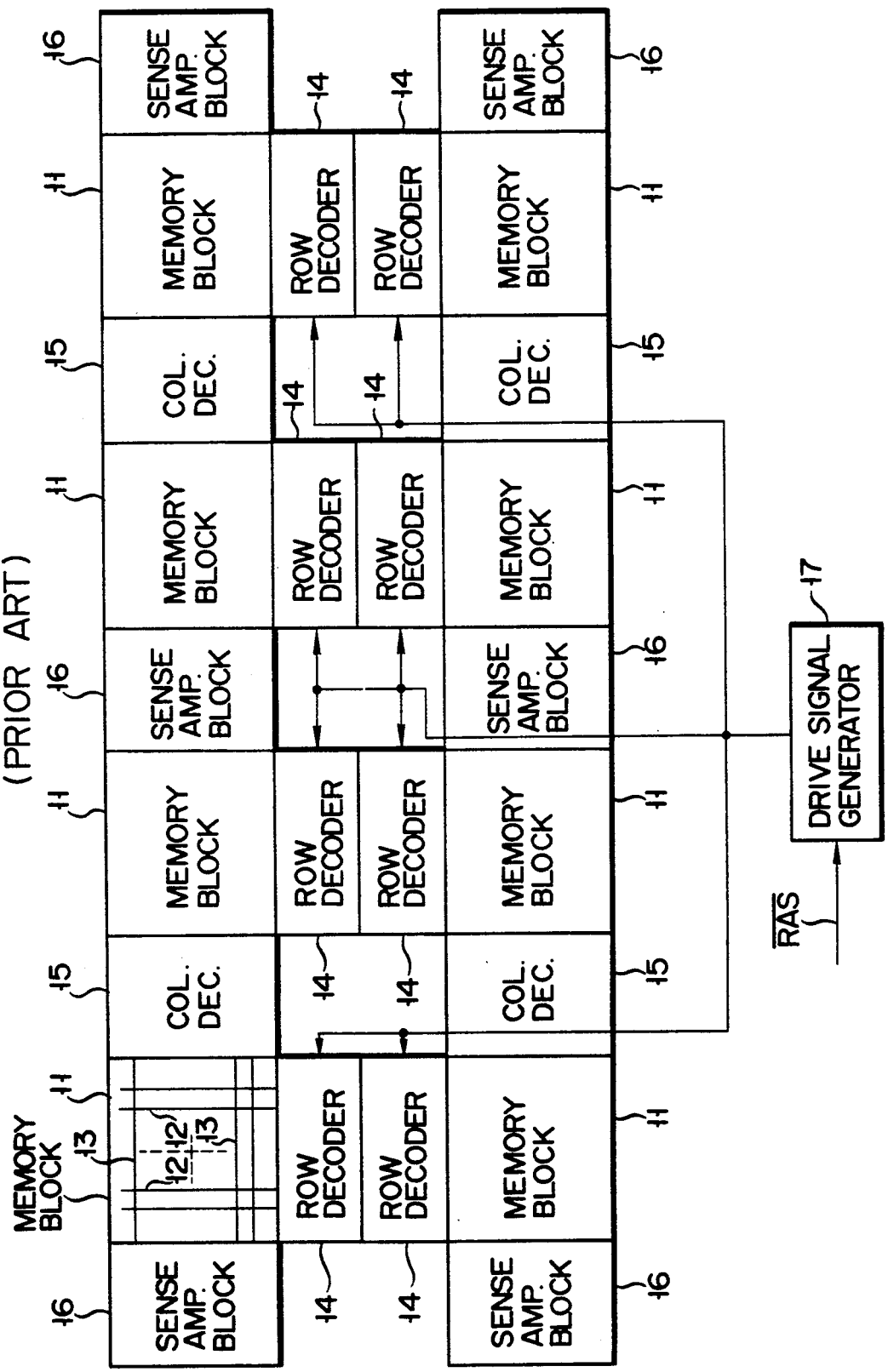
FIG. 1 is a schematic diagram showing the prior art memory device.
Figure 2:
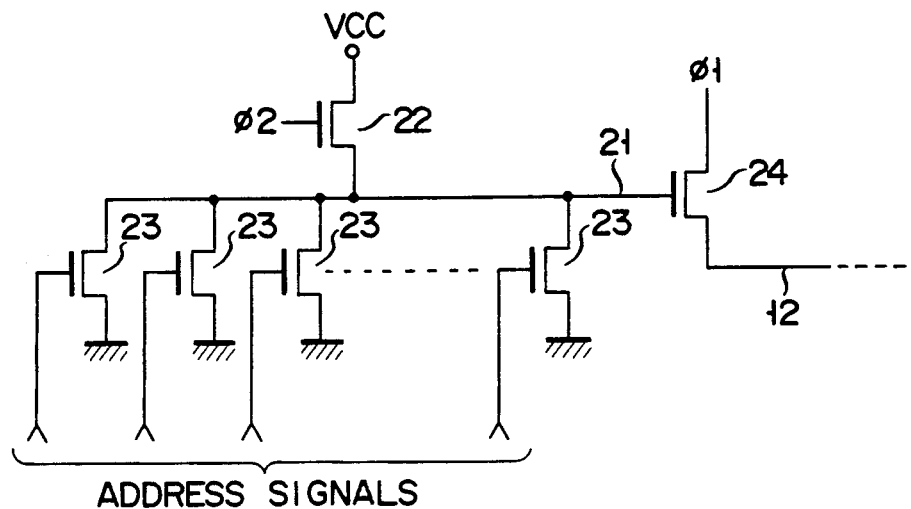
FIG. 2 is a circuit diagram of the row decoder used in the memory block of the device shown in FIG. 1.
Figure 5:
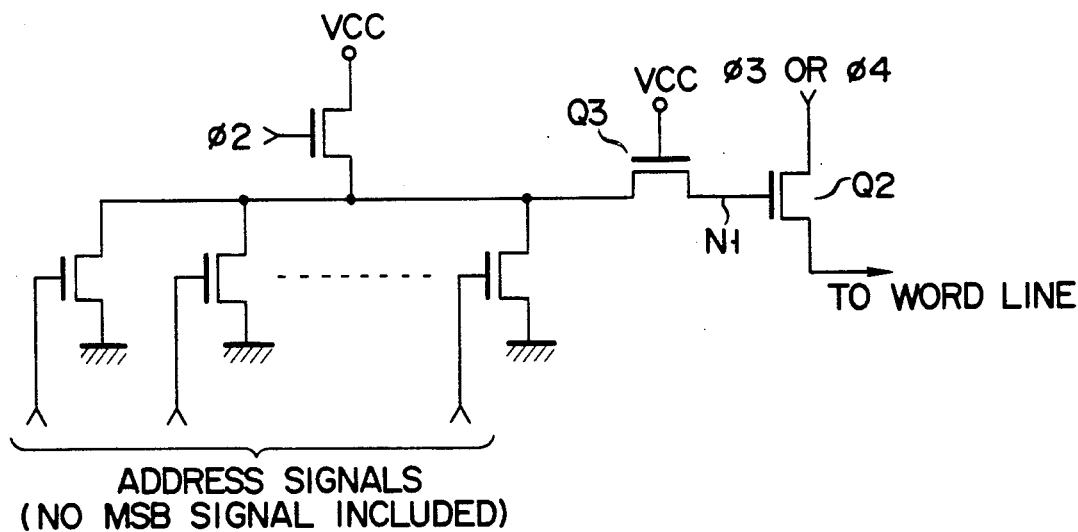
FIG. 5 is a circuit diagram of the row decoder used in the memory device of FIG. 3.

As shown in FIG. 5, row decoders 34A and 34B have substantially the same structure as the row decoder shown in FIG. 2 except for the absence of transistors to the gates of which MSB signal An or $\overline{An}$ is supplied. Node N1 is precharged by control signal $\phi$2 when it is precharged to high level. When a prescribed row address signal (except the MSB signal) is applied, all the MOS transistors that receive this address signal are turned off and node N1 is maintained at the precharged potential. When, in this state, control signal $\phi$3 or $\phi$4, which is supplied to one terminal of MOS transistor, rises, the potential of node N1 is pulled up as a result of the presence of barrier transistor Q3 so control signal $\phi$3 or $\phi$4 is transmitted to the word line coupled to the other terminal of transistor Q2 without a drop in potential.

Figure 6:
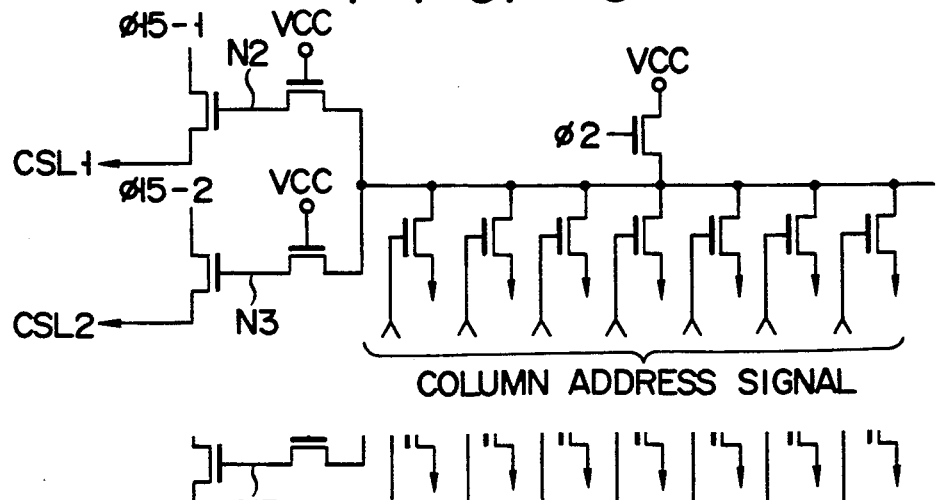
FIG. 6 is a circuit diagram of the column decoder used in the device of FIG. 3.

With column decoder 15, which is shown in FIG. 6, nodes N2 and N3 are precharged by control signal $\phi$2 when it is precharged to high level. When a prescribed column address signal (except part of the address signal) is applied, all the MOS transistors that receive this address signal are turned off and nodes N2 and N3 are maintained at the precharged potential. When, in this state, one of the control signals $\phi$15A and $\phi$15B corresponding to part of the address signal which is supplied to one terminal of MOS transistor rises, the potential of nodes N2 and N3 is pulled up to a level higher than Vcc so that control signals $\phi$15A and $\phi$15B are transmitted to control line CSL1 or CSL2 without a drop in potential.

Sense amplifier 36 amplifies the data read from or written into at least one memory cell selected by row decoder 34A or by row decoder 34B and column decoder 35. In other words sense amp block 36 amplifies and holds data read from the corresponding memory cell and holds the data that is to be written into a corresponding memory cell.

As shown in FIG. 4, this sense amp block includes a sense amp section and an equalize/restore section and, as can be seen from FIG. 7, reads out and amplifies the data in bit lines BL1 and BL2 after the rise of control signal $\phi$S2 following the rise of control signal $\phi$S1. Control signal $\phi$7 controls barrier transistor QB. Namely, before the sense operation, control signal $\phi$T is at a higher potential level than source voltage Vcc and so barrier transistor QB is made to operate in the triode region, while in the sense operation, control signal $\phi$T has approximately the same level as source Vcc so barrier transistor QB is made to operate in the pentode region, which has the effect that the stray capacitance associated with the bit lines does not adversely affect the operation of the sense amplifier.

At the end of the sense operation, the equalize/ restore section of the sense amplifier block sets the potential of the bit line to the high level "1" and when the bit line is precharged, equalizes the potential of a pair of the bit lines to precharge them as well. In the sense operation, the potential of the bit line that has been set to the high level is at a level lower than the potential at the time of the initial precharging. In order to make the rewriting of a memory cell reliable, the residual charge in one of paired capacitors CX is transferred to bit line BL1 or BL2 via paired MOS transistors QX by the rise of control signal $\phi$R, as is shown in FIG. 7, to compensate for their decreases in potential level. In this case, control signal $\phi$B rises higher than source voltage Vcc and the paired MOS transistors QX are turned on.

Also, in the precharged state, control signal $\phi$B is set at the source voltage level Vcc and capacitor CX is charged, while in the sense operation it is set at the same level of the precharge potential of bit lines BL1 and BL2, MOS transistor QX is turned off and the stray capacitance associated with the bit line is prevented from increasing by an amount of CX.

Drive signal generator 37, which generates signal $\phi$1 at the time of data read out or data writing, is a conventional signal generator that generates this signal in response to changes in the row address/strobe signal RAS supplied simultaneously with row address signals A1 to An.

Figure 8:
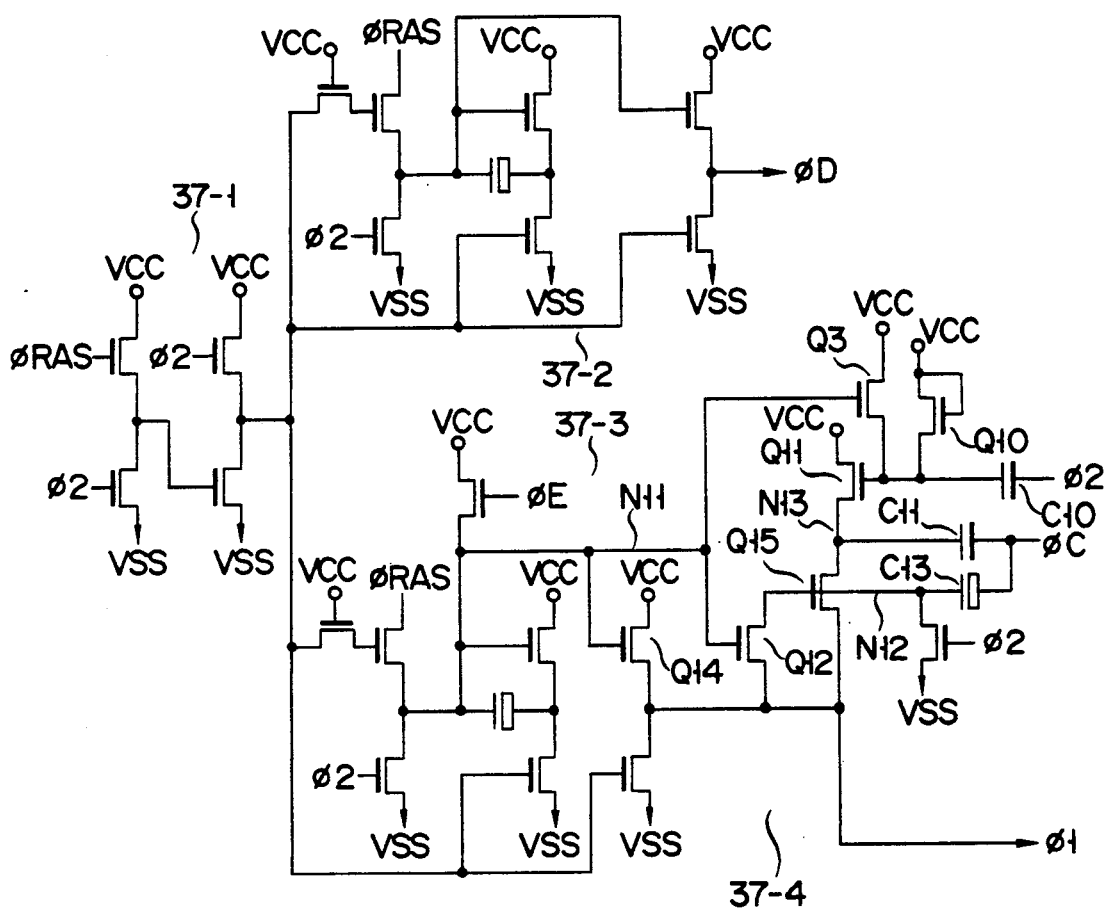
FIG. 8 is a circuit diagram of the drive signal generating circuit used in the device of FIG. 3.

As shown in FIG. 8, drive signal generator 37 includes delay circuit 37-1 for delaying control signal $\phi$RAS, bootstrap circuits 37-2 and 37-3 for stepping up the output signal from delay circuit 37-1 and pull-up circuit 37-4 for pulling up the output signal of these bootstrap circuit 37-3, 37-4 and outputting control signal $\phi$1.

Figure 9:
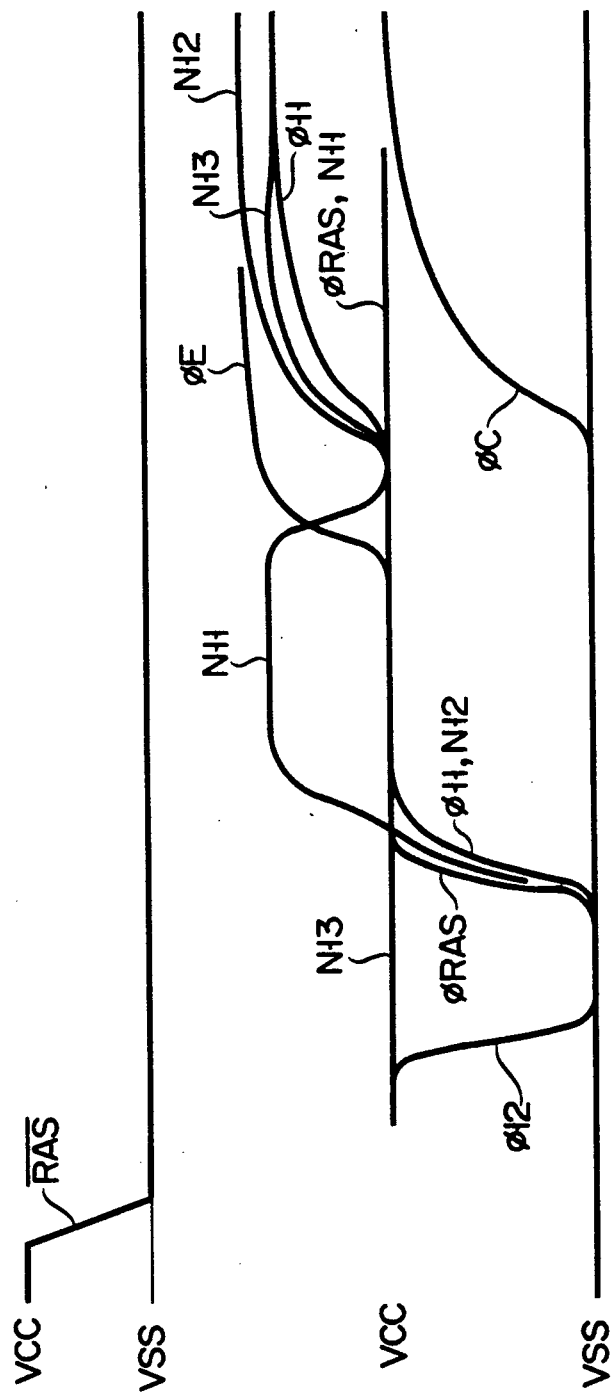
FIG. 9 is a signal waveform diagram showing the operation of the drive signal generating circuit of FIG. 8.

As shown in FIG. 9, drive signal generator 37 generates signal $\phi$D for raising the dummy-word-line control signal $\phi$DW or $\overline{\phi DW}$ by signal $\overline{\phi RAS}$ which rises as a result of the drop of row address/strobe signal $\overline{\phi RAS}$ and generates signal $\phi$1 for raising signal $\phi$Wi or $\overline{\phi Wi}$ for the word line. Signal $\phi$D is decoded according to the row address and raises signal $\phi$DW or $\overline{\phi DW}$. Signal $\phi$1 is set to be higher than Vcc in the end and has a high enough level to make it possible to rewrite data in memory cell CS. Capacitor C11 is precharged to Vcc level by MOS transistor Q11, whose gate is charged by transistor Q10, receives at this gate via capacitor C10 signal $\phi$2 which rises when precharged and which is turned on in the triode mode. When signal $\phi$RAS rises signal $\phi$1 rises to Vcc and signal $\phi$D also rises. This rise is the same as in a well known signal generator. At this time the level of node N11 is higher than Vcc so MOS transistor Q12 is turned on in the triode mode and node N12 is charged to the level of signal $\phi$1, or, Vcc.

Of course, capacitor C13 is also charged. Also, MOS transistor Q13 is turned on in the triode mode and the gate potential of MOS transistor Q11 reaches the Vcc and is turned off even though node N13 becomes high level. After a short period of time, signal $\phi$E rises to a level higher than Vcc and node N1 falls to Vcc so that MOS transistor Q12 remains turned off even if node N12 goes to high level. Furthermore, even if signal $\phi$1 goes to high level, MOS transistor 014 remains off. In this state, signal $\phi$C rises and MOS transistor Q15 is sufficiently turned on through the coupling with capacitor C13, so the charge in capacitor C11 is transferred via MOS transistor Q15 to raise signal $\phi$11 to the high level.

Signal $\phi$1 from drive signal generator 37 is supplied to drive signal selection circuit 38 to which MSB row address signal An is also supplied. Drive signal selection circuit 38 selects and outputs drive signal $\phi$1 as either signal $\phi$3 or $\phi$4 based on signal An. In this case, the selection signal $\phi$3 is supplied in parallel to each row decoder 34A and the other selection 4 is supplied in parallel to each row decoder 34B.

Figure 10:
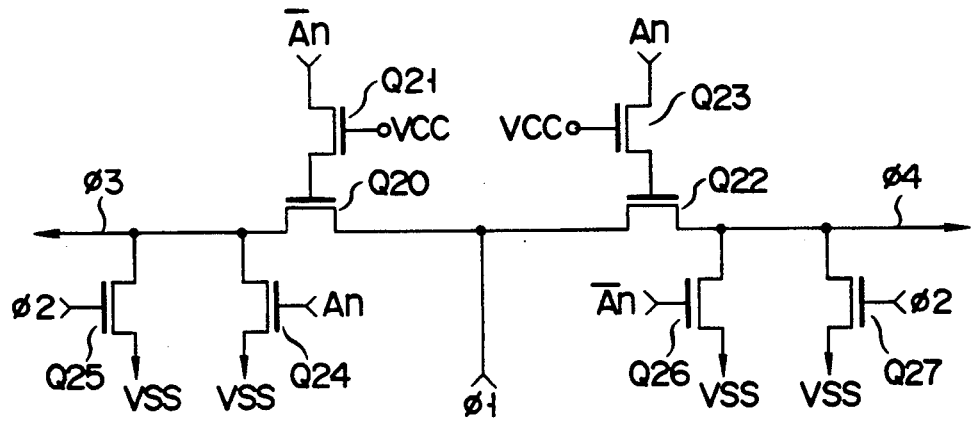
FIG. 10 is a circuit diagram of the drive signal selection circuit used in the device of FIG. 3.

FIG. 10 is a detailed circuit diagram of drive signal selection circuit 38.

This circuit comprises: MOS transistor Q20, to the gate of which is supplied inverted row address signal An via MOS transistor Q21, to one end of the current path of which is supplied signal $\phi$1, and which outputs selection signal $\phi$3 from the other end of its current path; MOS transistor Q22, to the gate of which is supplied row address signal An via MOS transistor Q23, to one end of the current path of which is supplied signal $\phi$1, and which outputs selection signal $\phi$4 from the other end of its current path; MOS transistors Q24 and Q25 which are provided between the output line for transmitting signal $\phi$3 and terminal Vss and to the gate of which signals $\phi$2 and An are supplied; and MOS transistors Q26 and 27 which are provided between the output line for transmitting signal $\phi$4 and terminal Vss and to the gates of which signals $\phi$2 and $\overline{An}$ are supplied.

With a memory device constructed as described above, when MSB row address signal An is set to 0 and data is read from or into the memory cells in one group of the memory blocks 31A, MOS transistors Q20 and Q26 of drive signal selection circuit 38 are turned on based on signal An and MOS transistors Q22 and Q24 are turned off. Accordingly, signal $\phi$1 output by drive signal generator 37 in response to signal $\overline{RAS}$ is output from drive signal selection circuit 38 as signal $\phi$3. In this case, as a result of the presence of barrier transistor Q21, the gate of MOS transistor Q20 is set at a higher potential than source Vcc so signal $\phi$3 is set at approximately the same level as signal $\phi$1.

The output terminal 4 is discharged to 0 level by turning on transistor Q26 of drive signal selection circuit 38. At this time, signal $\phi 3$ is supplied only to row decoder 34A and not to row decoder 34B and, accordingly, the number and overall length of the wires for transmitting signal $\phi 1$ to row decoder 34A are reduced by half so that the stray capacitance associated with the wires and the resistance of the wires is reduced compared to the prior art.

When, on the other hand, MSB row address signal An is set to 1 and data is read from or into the memory cell in the other group of memory blocks 31B, MOS transistors Q22 and Q24 of drive signal selection circuit 38 are turned on based on signal An and MOS transistors Q20 and Q26 are turned off. Accordingly, signal $\phi 1$ output by drive signal generator 37 is output from drive signal selection circuit 38 as signal $\phi 4$. At this time, signal $\phi 4$ is supplied only to row decoder 34B and not to row decoder 34B and, accordingly, the number and overall length of the wires for transmitting signal $\phi 1$ to row decoder 34B are reduced by half so that the stray capacitance associated with the wires and the resistance of the wires is reduced compared to the prior art.

According to the above embodiment, drive signal $\phi 1$, which is used to select and drive word line WL, is not supplied in parallel to all the row decoders 34A and 34B, as in the prior art, but rather is selectively supplied to only to the row decoder 34A or 34B that corresponds to memory block 31A or 31B in which a memory cell has been selected. The result is that even if the total number of row decoders 34A and 34B is high, the actual number of decoders to which signal $\phi 1$ is supplied is half that of the prior art and, consequently, the stray capacitance of the wires and their resistance is reduced compared to the prior art. Also, the time required until selected word line WL rises to level 1 is greatly reduced, which results in improved operating speed of the device.

Since it is possible to improve the operating speed without greatly increasing the current capacity of signal $\phi 1$, it is not necessary to increase the element area of the transistors that constitute drive signal generator 37, which makes it possible to reduce the chip area for circuit integration.

Also, according to this embodiment, since selection signal $\phi 1$ by drive signal selection circuit 38 is based on the MSB row address signal An, it is not necessary to perform the decoding operation based on MSB signal An for each row decoder 34 and, consequently, one transistor for each row decoder 34A and 34B is not required, which results in simplification of the structure of these decoders.

This invention is not limited to the above embodiment and various modifications are possible within the scope of the invention. For example, in the above embodiment the memory blocks were divided into two groups (memory blocks 31A and 31B) based on MSB row address signal An. However, it also possible to divide the memory blocks into two groups based on bit signals other than the MSB row address signal. Furthermore, in the above embodiment, drive signal selection circuit 38 selects signal $\phi 1$ based on the 1-bit row address signal, however, it is also possible to increase the number of selections by increasing the number of bits of the row address signal and dividing the memory blocks into more than two groups to thereby further decrease the number of row decoders to which signal $\phi 1$ must be supplied.

This invention is able to provide a semiconductor memory device in which the selected word line can be driven in a short time to thereby increase the operating speed, and in which the chip area can be reduced for IC integration.

What is claimed:

1. A semiconductor memory device, comprising:
   a plurality of memory blocks, each memory block constituting a plurality of memory groups, with each of said memory groups including a plurality of memory cells and a plurality of word lines for selecting said memory cells;
   a plurality of word line selection means connected to said word lines, numbering at least one for each of said memory groups, for selecting at least one of said word lines in said memory block in response to part of a word line selection address signal, and for biasing this selected word line with an input drive signal;
   a drive signal generating means for generating said input drive signal for driving said word line; and
   a drive signal selection means connected to said word line selection means and to said drive signal generating means for selectively supplying said input drive signal from said drive signal generating means to said word line selection means corresponding to one of the memory groups specified by a remaining part of said word line selection address signal;
   wherein said plurality of memory blocks are divided into first and second memory groups, and said drive signal selection means comprises first and second MOS transistors, each of which has a current path coupled at one end to an output terminal of said drive signal generating means and which respectively receive at their gates a prescribed one bit address signal of said word line selection address signal and an inverted one bit address signal of said word line selection address signal, the other end of the current path of said first MOS transistor being coupled to said word line selection means which are coupled to said first memory group, and another end of the current path of said second MOS transistor being coupled to said word line selection means which are coupled to said second memory group.

2. A semiconductor memory device according to claim 1, wherein said drive signal selection means further includes a third MOS transistor which is coupled between a source potential terminal (Vss) and the other terminal of the current path of said first MOS transistor, and to the gate of which the inverted one bit address signal is supplied, and a fourth MOS transistor which is coupled between a source potential terminal (Vss) and the other terminal of the current path of said second MOS transistor, and to the gate of which said one bit address signal is supplied.

3. A semiconductor memory device according to claim 2, wherein said drive signal selection further includes a MOS transistor with said one bit address signal supplied to one end of its current path, with the other end of its current path supplying a one bit address signal to the gate of said first MOS transistor, and to the gate of which is supplied a prescribed voltage, and a MOS transistor having said inverted one bit address signal supplied to one end of its current path, the other end of which supplies a one bit address signal to the gate of said first MOS transistor, and to the gate of which is supplied a prescribed voltage.

4. A semiconductor memory device according to claim 3, wherein said drive signal selection means further includes a MOS transistor with said one bit address signal supplied to one end of its current path, with the other end of its current path supplying a one bit address signal to the gate of said first MOS transistor, and to the gate of which is supplied a prescribed voltage, and a MOS transistor with said inverted one bit address signal supplied to one end of its current path the other end of which supplies a one bit address signal to the gate of said first MOS transistor, and to the gate of which is supplied a prescribed voltage.

5. A semiconductor memory device, comprising:
a plurality of memory blocks, each memory block constituting a plurality of memory groups, with each of said memory groups including a plurality of memory cells and a plurality of word lines for selecting said memory cells;
a plurality of word line selection means connected to said word lines, numbering at least one for each of said memory groups, for selecting at least one of said word lines in said memory block in response to part of a word line selection address signal, and for biasing this selected word line with an input drive signal;
a drive signal generating means for generating said input drive signal for driving said word line; and
a drive signal selection means connected to said word line selection means and to said drive signal generating means for selectively supplying said input drive signal from said drive signal generating means to said word line selection means corresponding to one of the memory groups specified by a remaining part of said word line selection address signal;
wherein said plurality of memory blocks are divided into first and second memory groups and said word line selection means is coupled to each of said memory groups and said drive signal selection means comprises first and second MOS transistors each of which has a current path coupled at one end to an output terminal of said drive signal generating means and which respectively receive at their gates a prescribed one-bit address signal of said word line selection address signal and an inverted one bit address signal of said word line selection address signal, the other end of the current path of said first MOS transistor being coupled to said word line selection means which are coupled to said first memory group, and the other end of the current path of said second MOS transistor being coupled to word line selection means which are coupled to said second memory group.

6. A semiconductor memory device, comprising:
drive signal generating means for generating an input drive signal, said input drive signal having a higher one of levels of two potentials stored in a memory cell;
a plurality of word line selection blocks each including a plurality of word lines;
drive signal selection means, coupled to receive a word line selection address signal, for transmitting said input drive signal from said drive signal generating means to a selected one of said plurality of word line selection blocks in response to the word line selection address signal;
word line selection means associated with each of said plurality of word line selection blocks for receiving said input drive signal from said drive signal selection means and for biasing a selected one of said plurality of word lines of said selected word line selection block with said input drive signal; and
a plurality of memory groups connected to said word line selection means, said memory groups including a plurality of said memory cells;
wherein said drive signal selection means comprises at least two MOS transistors, one end of a current path of a first one of said two MOS transistors being connected to said drive signal generating means, another end of said current path of said first one of said two MOS transistors being connected to one said plurality of memory groups, one end of a current path of a second one of said two MOS transistors being connected to said drive signal generating means, another end of said current path of said second one of said two MOS transistors being connected to another one of said plurality of memory groups, the gates of said first and second MOS transistors receiving a signal determined by at least one prescribed bit of said word line selection address signal and an inversion of said at least one prescribed bit of said word line selection address signal.

* * * * *